(12) United States Patent
Cho

(10) Patent No.: US 7,961,127 B2
(45) Date of Patent: Jun. 14, 2011

(54) VARIABLE GAIN STAGE HAVING SAME INPUT CAPACITANCE REGARDLESS OF THE STAGE GAIN

(75) Inventor: Taehee Cho, Irvine, CA (US)

(73) Assignee: Micron Technology, Inc., Boise, ID (US)

( * ) Notice: Subject to any disclaimer, the term of this patent is extended or adjusted under 35 U.S.C. 154(b) by 987 days.

(21) Appl. No.: 11/781,413

(22) Filed: Jul. 23, 2007

(65) Prior Publication Data

US 2009/0027524 A1 Jan. 29, 2009

(51) Int. Cl.
*H03M 1/00* (2006.01)

(52) U.S. Cl. ......... 341/138; 348/255; 341/122; 330/278

(58) Field of Classification Search .................. 341/122, 341/138; 330/278; 348/255
See application file for complete search history.

(56) References Cited

U.S. PATENT DOCUMENTS

| 5,892,472 | A | 4/1999 | Shu et al. |
| 6,388,500 | B1 | 5/2002 | Lee et al. |
| 6,753,801 | B2 | 6/2004 | Rossi |
| 6,768,374 | B1 | 7/2004 | Lee |
| 7,106,240 | B2 | 9/2006 | Cringean |
| 7,215,202 | B2 | 5/2007 | Al-Shyoukh et al. |
| 2002/0050940 | A1* | 5/2002 | Sato et al. ............ 341/155 |
| 2005/0018061 | A1 | 1/2005 | Choi |
| 2005/0046460 | A1* | 3/2005 | Ranganathan ........ 327/377 |
| 2006/0017827 | A1 | 1/2006 | Tani et al. |
| 2006/0033561 | A1 | 2/2006 | Perdoor et al. |
| 2006/0164164 | A1 | 7/2006 | Rogers et al. |
| 2007/0030262 | A1 | 2/2007 | Ambo et al. |

FOREIGN PATENT DOCUMENTS

GB 2 419 047 A 4/2006

OTHER PUBLICATIONS

PCT/US2008/005826, filed Jul. 5, 2008, International Search Report issued Jun. 13, 2008, pp. 1-3.
PCT/US2008/005826, filed Jul. 5, 2008, Written Opinion of the International Searching Authority, issued Jun. 13, 2008, pp. 1-6.

* cited by examiner

*Primary Examiner* — David L Ometz
*Assistant Examiner* — Antoinette T Spinks
(74) *Attorney, Agent, or Firm* — RatnerPrestia

(57) ABSTRACT

A programmable gain amplifier (PGA) includes a sample-and-hold (S&H) stage which provides an input capacitance value for storing a charge. The PGA also includes an amplifying stage, which has a gain dependent on the input capacitance value. The amplifying stage is configured to provide a variable gain, while the S&H stage is configured to provide a substantially constant input capacitance value, regardless of the gain.

26 Claims, 10 Drawing Sheets

VARIABLE GAIN STAGE HAVING SAME INPUT CAPACITANCE REGARDLESS OF THE STAGE GAIN

FIELD OF THE INVENTION

The present invention relates to an imaging system. More specifically, the present invention is directed to a programmable gain amplifier (PGA) used as a sample-and-hold stage and an amplifying stage in an imaging system.

BACKGROUND OF THE INVENTION

FIG. 1 is an illustration of a conventional imaging system 100. The system 100 includes an N×M array 110 of pixels P. The system 100 may be monochromatic or color. If system 100 is a color system, the pixels P in the array 110 would be sensitive to the primary colors of red, green, or blue, and would typically be arranged in a Bayer pattern (i.e., alternating rows are comprised of green/red and blue/green sensitive pixels in adjacent columns).

Each pixel P in array 110 converts incident light into electrical energy, which is output as an electrical signal. The signals from the N pixels forming a row in array 110 are typically output on respective column lines to respective sample-and-hold circuits 120, which store the electrical signals. These signals are then selected, one pixel at a time, for further processing by driver 130, and then converted into a digital signal by analog-to-digital converter (ADC) 140. The digital signals are further processed by digital processing section 150, and then stored by storage device 160. When all the signals stored in the sample-and-hold circuits 120 have been processed, another row of signals is output and stored in sample-and-hold circuit 120 and the processing continues until each row of the N×M array 110 has been processed. The above described processing may be controlled by control circuit 170. Alternatively, control circuit 170 may include a plurality of control circuits.

The driver 130 may be an amplifier with programmable gain that increases lower level signals resulting from lower light level conditions in an attempt to utilize the full range of the ADC stage.

In addition, each pixel typically has a color filter over it, so that each pixel is responsive to light only in a given frequency band, typically corresponding to either a red, green, or blue color. In addition to the color filter, the silicon of the pixels converts different frequencies of light with different efficiencies. The conversion efficiency is greater for the red color band than for the blue color band. Thus, the amplification needed for each of the color band signals is different.

For economic reasons in fabricating integrated circuits, it is important to keep the size of the integrated circuit die small. As such, increasing the number of pixels in an image sensor array results in an effort to reduce the size of the individual pixels, so as to keep the overall die size as small as possible. The smaller pixel sizes reduce the light sensitivity of the pixels and cause a need for higher programmable amplifier gains. Higher pixel counts lead to faster system clock speeds, in order to be able to capture an image in a desired period of time.

Typically, when an amplifier is designed, the requirements for the amplifier in terms of gain and frequency response are determined. The amplifier is designed so that it achieves a desired output settling at the maximum bandwidth (speed of signal capture and processing), while amplifying the signal at the maximum gain setting.

The modern CMOS image sensor, typically, integrates the programmable gain amplifier (PGA) and the ADC on a single chip. In the chip, a sample-and-hold (S&H) stage converts the unipolar pixel output into a bipolar fully differential signal, in order to increase signal-to-noise ratio. At the same time, the S&H stage multiplies the input signal by a ratio of a feedback capacitor size to the sampling capacitor size. If the total input capacitance changes with the gain, the PGA cannot optimize its performance very well.

Accordingly, there is a need for a method and a system for performing a sample and hold (S&H) function and a variable amplification (gain) function in a PGA that has a fixed total input capacitance, regardless of the stage gain.

DETAILED DESCRIPTION OF THE INVENTION

In the following detailed description, reference is made to the accompanying drawings which form a part hereof, and which illustrate specific embodiments of the present invention. These embodiments are described in sufficient detail to enable those of ordinary skill in the art to make and use the invention. It is also understood that structural, logical or procedural changes may be made to the specific embodiment disclosed without departing from the spirit and scope of the present invention.

Figure 1:
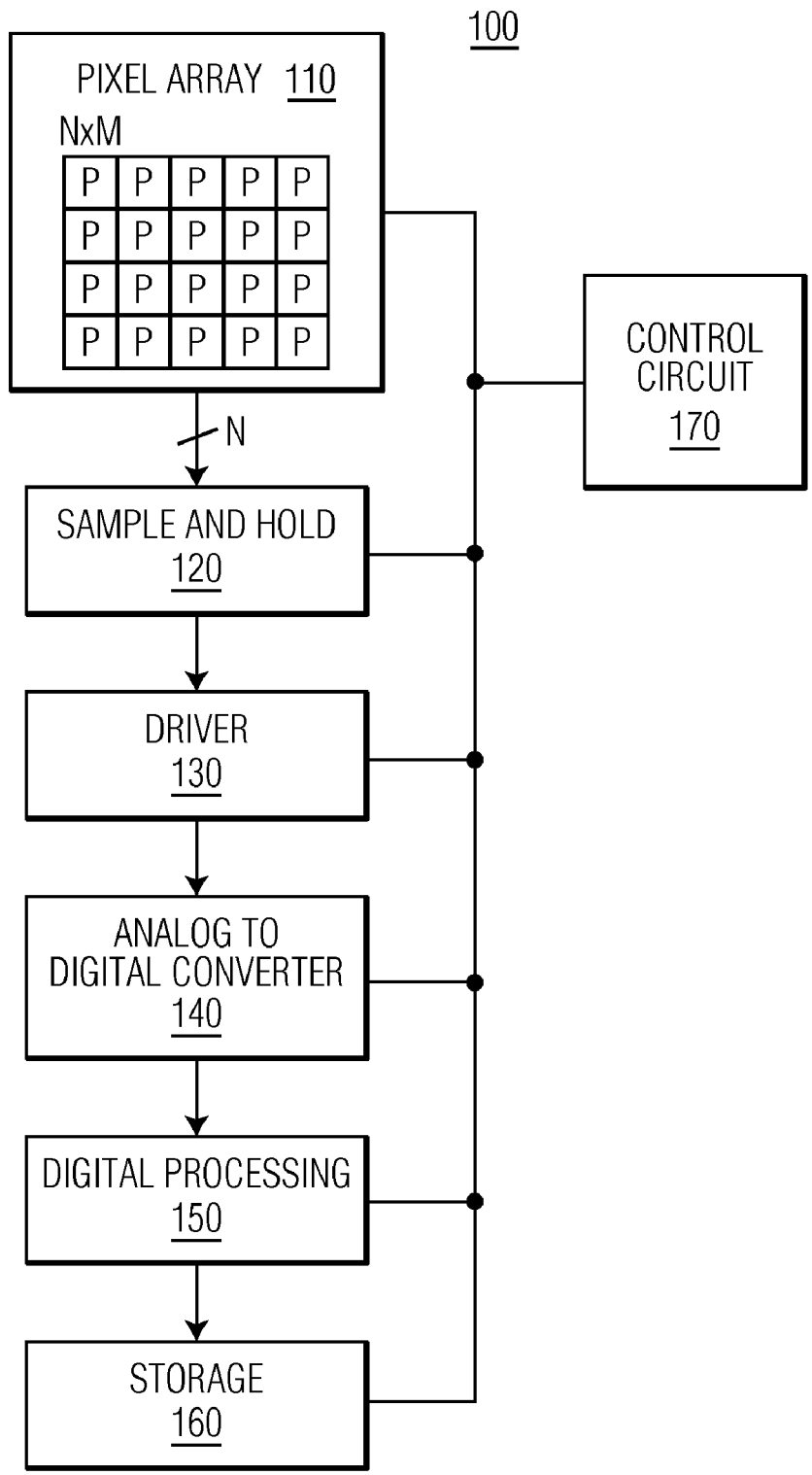
FIG. 1 is a block diagram of a conventional imaging system.
Figure 4:
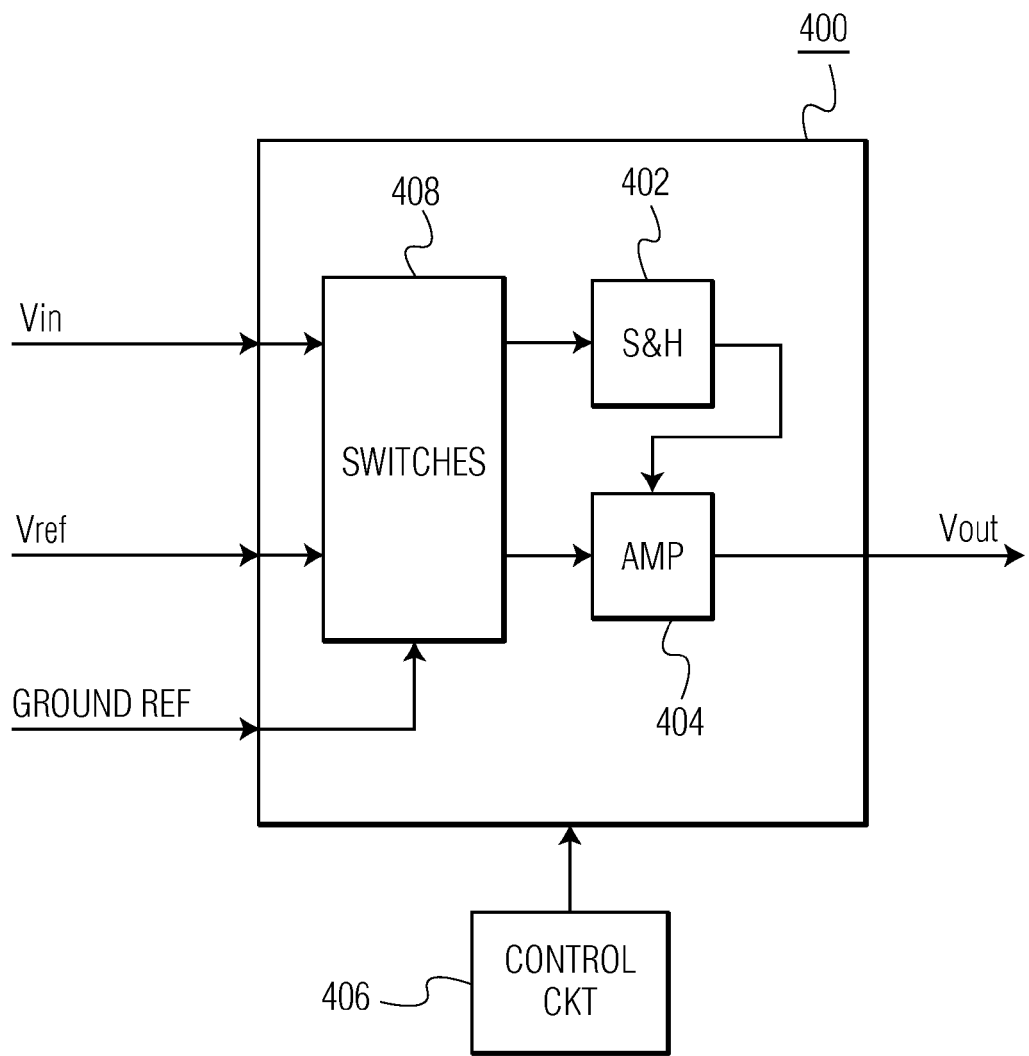
FIG. 4 is a block diagram of a PGA.

Referring first to FIG. 4, there is shown a functional block diagram of PGA 400 including S&H stage 402, amplifying stage 404 and multiple switches 408. As will be explained, control circuit 406 (also shown as control circuit 170 in FIG. 1) activates and deactivates the S&H stage during one phase and the amplifying stage during another phase. Control circuit 406 controls multiple switches 408 to provide one or a combination of (1) an input voltage $V_{in}$, (2) a reference voltage $V_{ref}$ and (3) a ground reference to S&H stage 402 or amplifying stage 404. As also shown, the output signal (a charge) from S&H stage 402 is provided as an input signal to amplifying stage 404. A voltage output signal $V_{out}$ is typically provided from the amplifying stage to an ADC and/or a digital processor (for example, ADC 140 and/or digital processor 150, shown in FIG. 1).

As will be explained, the present invention includes a programmable gain amplifier (PGA). The PGA includes a sample-and-hold (S&H) stage having an input capacitance value for storing a charge, and an amplifying stage having a gain dependent on the input capacitance value. The amplifying stage is configured to provide a variable gain, and the S&H stage is configured to provide a substantially constant input capacitance value. More specifically, the PGA includes an input voltage $V_{in}$ and a reference voltage $V_{ref}$. The amplifying stage is configured to provide an output voltage of $V_{out}$, as follows:

$$V_{out} = GV_{in} - V_{ref}$$

where G is a variable gain, and the input capacitance value is substantially constant for the variable G.

Another embodiment of the present invention is a PGA including (1) a S&H stage for sampling an input voltage $V_{in}$, (2) an operational amplifier for amplifying the sampled voltage $V_{in}$ and providing an output voltage $V_{out}$, (3) multiple capacitors, each having first and second terminals, and (4) a control circuit for controlling charging and discharging of the multiple capacitors. Each of the multiple capacitors are charged to a substantially constant level by the control circuit, when the S&H stage is activated. At least one capacitor is discharged differently from another capacitor of the multiple capacitors by the control circuit, when the operational amplifier is activated to provide a variable amount of amplification between $V_{in}$ and $V_{out}$. The multiple capacitors are configured to provide a substantially constant input capacitance, regardless of the amount of amplification between $V_{in}$ and $V_{out}$.

Still another embodiment of the present invention is a method of controlling a PGA having a S&H phase and an amplifying phase. The method includes the steps of:

(a) charging multiple capacitors, during the S&H phase, by sampling an input voltage $V_{in}$;

(b) controlling the multiple capacitors during the S&H phase, by storing a substantially constant charge Q based on the input voltage $V_{in}$;

(c) discharging the multiple capacitors, during the amplifying phase, to provide an output voltage $V_{out}$ at an output terminal of an operational amplifier; and (d) controlling the multiple capacitors, during the amplifying phase, to provide a desired gain between $V_{in}$ and $V_{out}$. Controlling the multiple capacitors includes providing a variable gain between $V_{in}$ and $V_{out}$, after storing the substantially constant charge Q.

Referring next to FIGS. 2a, 2b, 2c and 2d, a PGA having a S&H stage and an amplifying stage will now be described. As shown, PGA 200 includes amplifier 212; multiple capacitors C1, C2, C3 and C4; and multiple switches 202, 204, 206, 208, 210 and 216. The multiple switches control the charging/discharging of the multiple capacitors, by connecting/disconnecting the capacitors from nodes 1, 2, 3, 4 and 5. The input voltage $V_{in}$ and output voltage $V_{out}$ are coupled to nodes 1 and 5, respectively. The voltage reference $V_{ref}$ is coupled to node 3, and the ground reference is coupled to nodes 2 and 4.

The amplifier 212 includes an inverting input (negative terminal) and a non-inverting input (positive terminal). The output of the amplifier is connected to node 5, which provides the voltage output $V_{out}$. The amplifier may be an operational amplifier having programmable signal gain, whose bias state is also programmable based upon the signal gain setting of the amplifier.

Depending upon the application, the signal gain that is needed may be determined from the conditions in which the system is operating. In particular, for an image sensor, various images may be captured at a number of signal gain settings. The gain may then be programmed into the system with a value that is sufficiently large, but which does not drive the amplifier into saturation or into a non-linear region.

The control signal which sets the programmable signal gain of the amplifier may be used to set how strongly biased the amplifier is. The signal gain and the bias state may be continuously adjusted, or adjusted in steps. Typically, a system adjustable in steps is less complicated to design than a continuously adjustable system. As an example, the system may be adjustable at say ¼, ½, ¾, full gain, 2× gain, 4× gain, etc., with the bias state adjusted accordingly. Thus, once the gain is determined, the gain may be programmed into decoding gates that trigger the bias conditions to adjust appropriately. Such adjustment is preferably performed automatically by control circuit 406.

In representative architectures, images captured by image sensor chips include not only the light sensitive pixels, but also an analog processing circuit. Once the analog signal has been digitized, digital circuitry (often on the same chip) performs various digital signal processing functions, such as balancing color channels, performing image processing algorithms to clean up an image, perform view finding, etc. In a view finding mode, for example, the system begins at the minimum gain and examines the digital values obtained for the exposed pixels. The system adjusts the gain upward, until the system begins to receive a certain majority of pixel values near the upper count level. This analysis is performed very rapidly perhaps 15 times per second. Typically, only a portion of the array is used during the view finding mode, so that the system processes the data faster to find the appropriate gain. Thus, the system quickly determines how much light is incident upon the image sensor and how much gain is needed.

Furthermore, the system determines the gain needed for each of the separate color channels. This may be a continually acting iterative process. Thus, the gain may be programmed to change as the scene changes. In like manner, the change in gain may be programmed to adjust the bias condition appropriately.

Returning to FIGS. 2a-2d, a first terminal of each capacitor C1, C2, C3, and C4 is connected to the inverting input of amplifier 212. The second terminal of each capacitor is connected to a specific signal (such as $V_{in}$, $V_{out}$, $V_{ref}$, or ground reference) by way of switches 202, 204, 206, 208 and 210. The inverting input of amplifier 212 is connected to the ground reference, by way of switch 216. How and when these switches are opened or closed depend on whether PGA 200 is in the S&H phase (executed by the S&H stage of PGA 200) or in the amplifying phase (executed by the amplifying stage of PGA 200). The operation of these switches during the S&H phase and the amplifying phase will now be described.

Figure 2A:
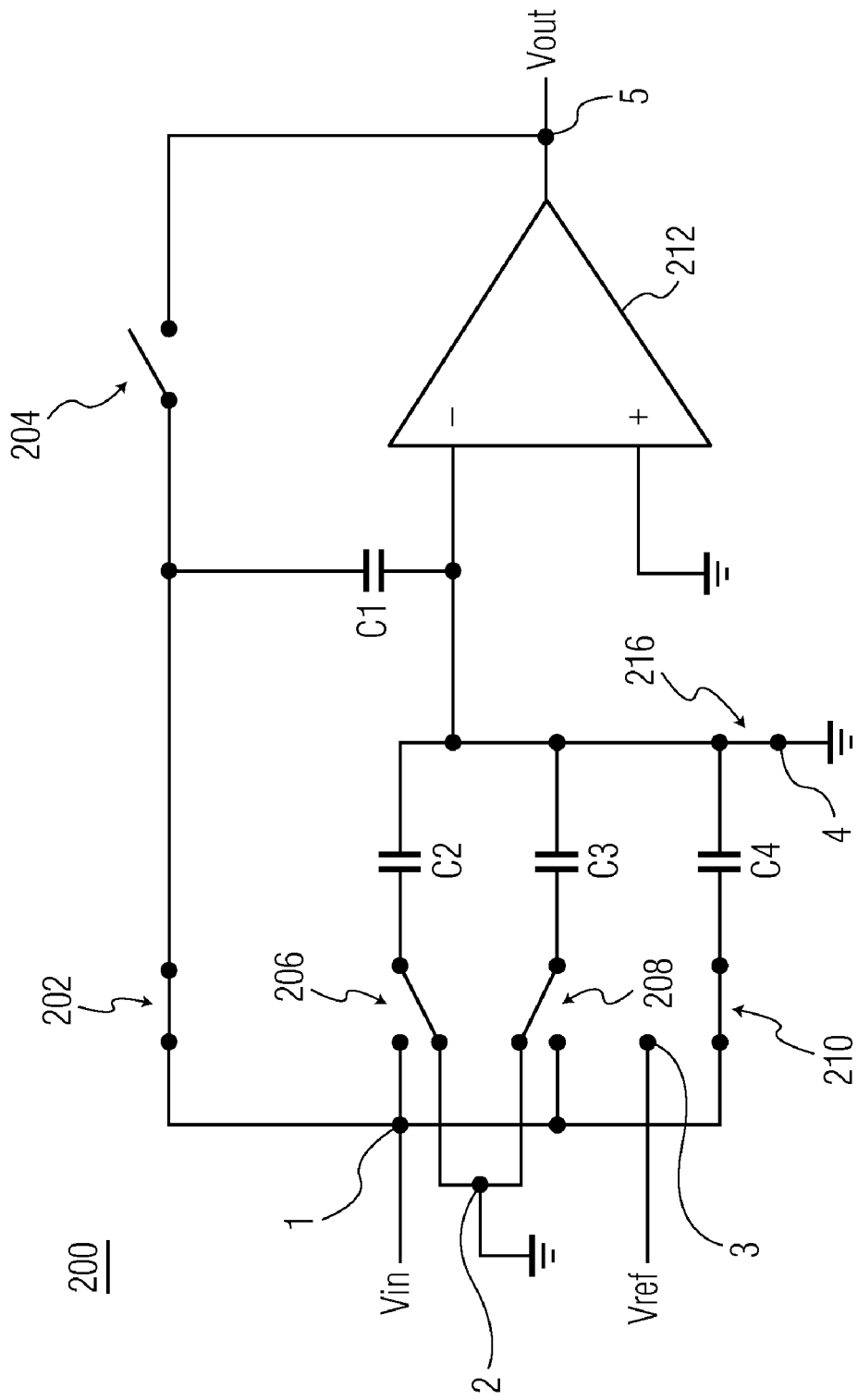
FIG. 2a is a schematic diagram of a programmable gain amplifier (PGA) providing two times (2×) gain, configured to operate as a sample and hold (S&H) stage.

FIG. 2a depicts the S&H stage for implementing the required sampling to obtain a two times (2×) gain of $$2V_{in} - V_{ref}$$

As shown, switch 216 is closed, thereby connecting the inverting input of amplifier 212 to the ground reference (node 4). In addition, switches 202 and 210 are closed and switch 204 is opened, thereby connecting the second terminals of capacitors C1 and C4 to $V_{in}$ (node 2) and allowing capacitors C1 and C4 to accumulate a charge of $$Q_{1,4}=(C1+C4)V_{in}.$$

Finally, since both capacitors C2 and C3 are connected to the ground reference (node 2), by way of switches 206 and 208, there is no charge accumulated by either capacitor C2 or capacitor C3.

Figure 2B:
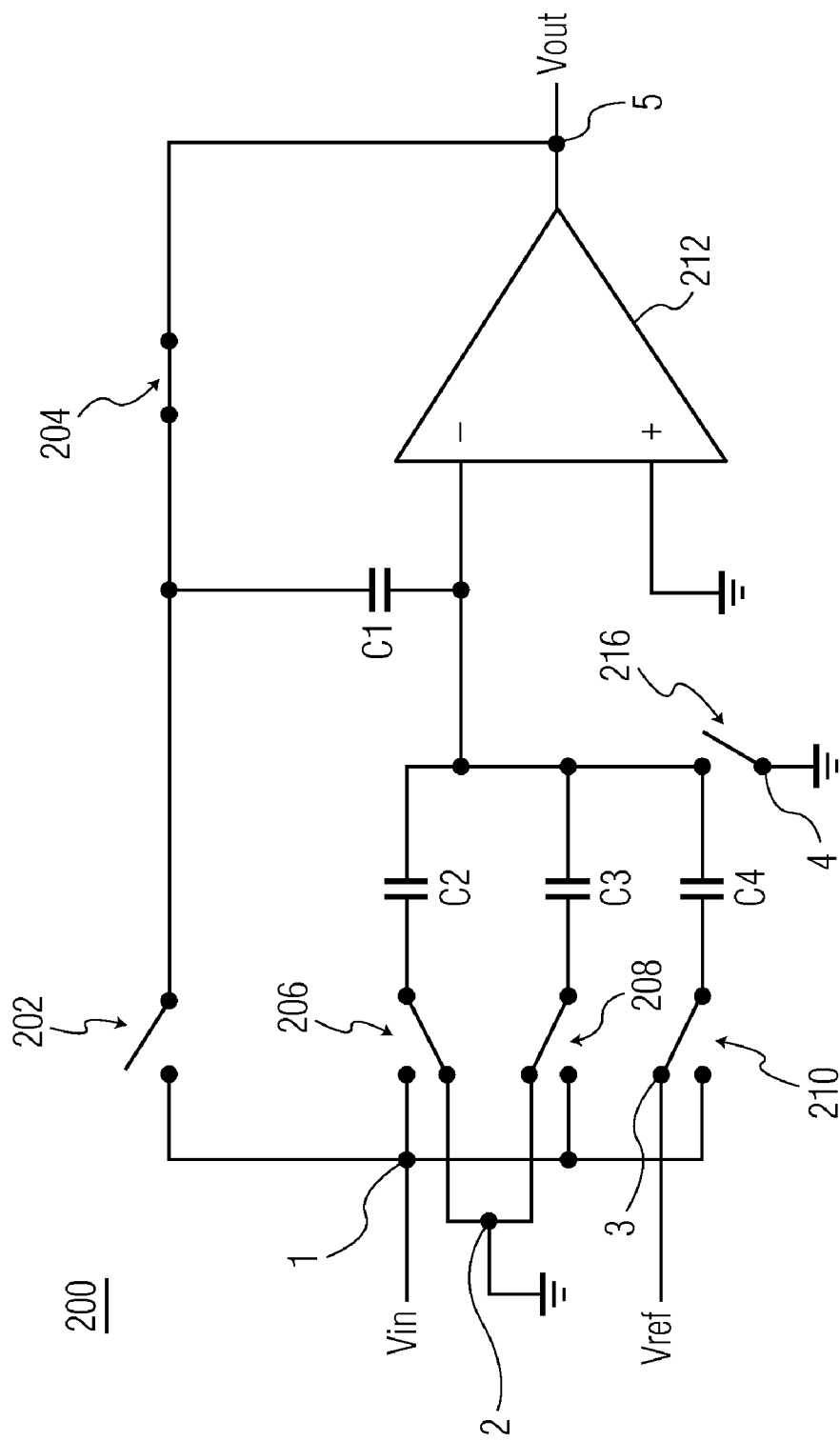
FIG. 2b is a schematic diagram of the PGA shown in FIG. 2a providing two times (2×) gain, configured to operate as an amplifying stage.

The amplifying stage is activated, after completing the above described S&H phase. Referring next to FIG. 2b, there is shown the amplifying stage for implementing the two times (2×) gain of $[2V_{in}-V_{ref}]$.

As shown in FIG. 2b, PGA 200 is now configured to operate in the amplifying phase. Accordingly, switch 216 is opened, thereby removing the ground reference (node 4) from the inverting input of amplifier 212. In addition, switch 202 is opened and switch 204 is closed, thereby connecting the second terminal of capacitor C1 to node 5, or the output voltage $V_{out}$ of amplifier 212. As a result, the entire charge across capacitor C1 is now placed between the inverting node and output node 5 of amplifier 212. This conserves the charge accumulated by capacitor C1.

Capacitors C2 and C3 remain connected to the ground reference of node 2, by way of switches 206 and 208, as shown in FIG. 2b. The second terminal of capacitor C4, however, is now connected by switch 210 to $V_{ref}$ (node 3). As a result of C4 now connected to $V_{ref}$, an additional charge of $$Q_4=C4(V_{in}-V_{ref})$$

is provided to capacitor C1. Therefore, the final charge, $Q_f$, stored in capacitor C1 is as follows:

$$Q_f=C1V_{in}+C4(V_{in}-V_{ref}).$$

It will be appreciated that the same value of capacitance, C, is used for each capacitor C1, C2, C3, and C4. As a result, the voltage level at output node 5 is as follows:

$$V_{out}=(2CV_{in}-CV_{ref})/C \text{ or}$$

$$V_{out}=2V_{in}-V_{ref}.$$

Figure 2C:
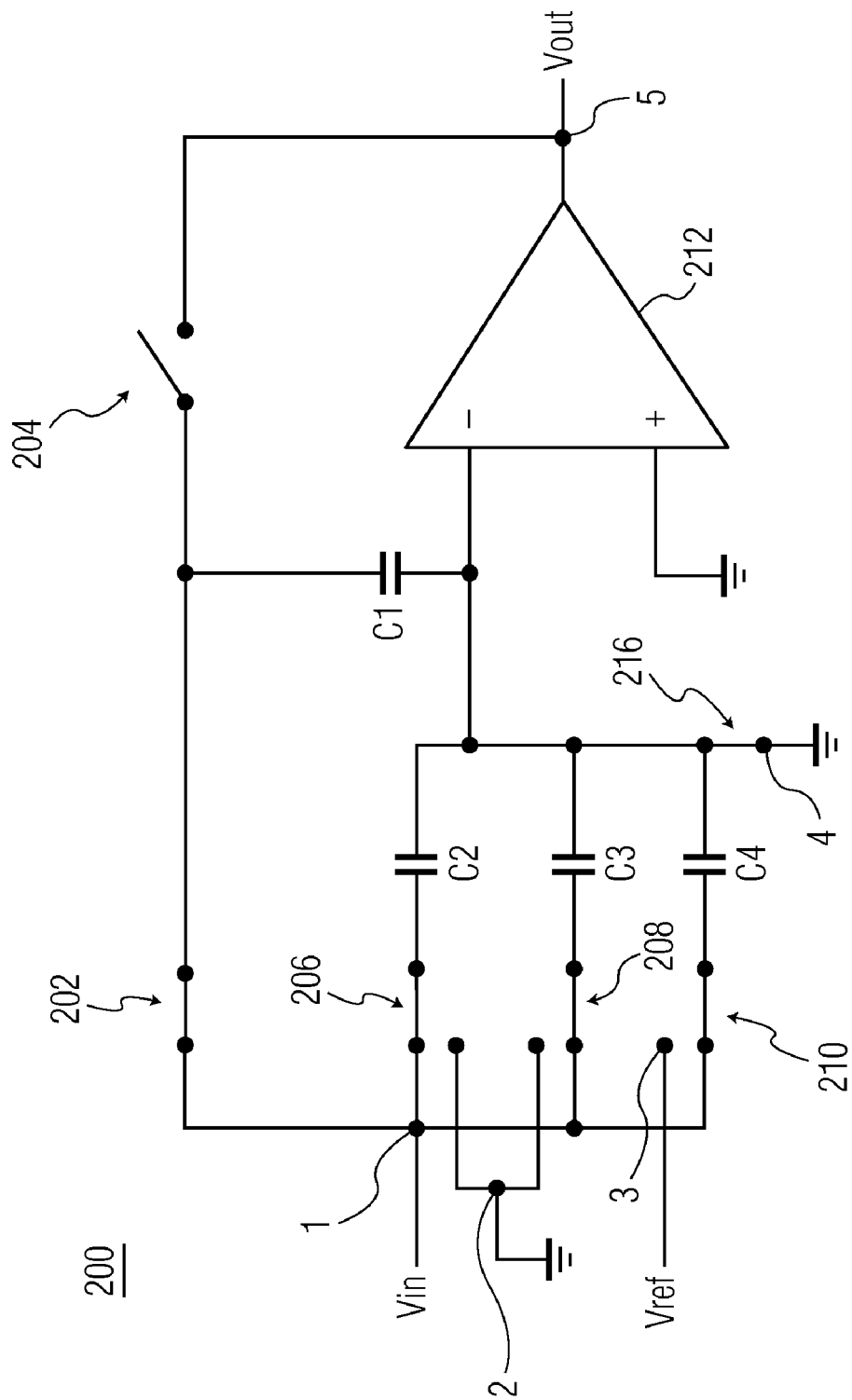
FIG. 2c is a schematic diagram of the PGA shown in FIG. 2a providing four times (4×) gain, configured to operate as a sample and hold (S&H) stage.
Figure 2D:
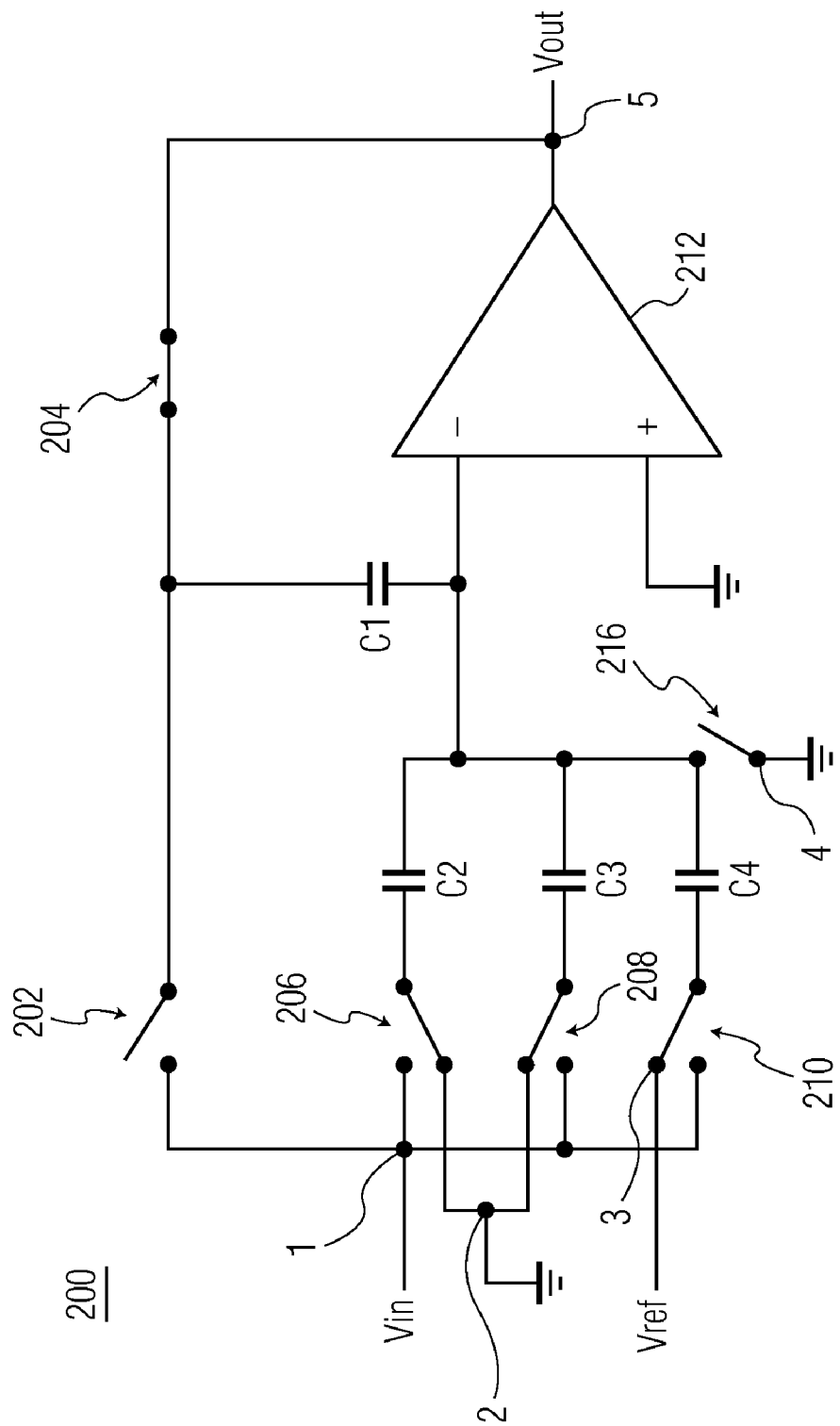
FIG. 2d is a schematic diagram of the PGA shown in FIG. 2a providing four times (4×) gain, configured to operate as an amplifying stage.

FIGS. 2c and 2d will now be described. Whereas FIGS. 2a and 2b depict PGA 200 operating in the S&H phase and the amplifying phase, respectively, when providing a 2 times (2×) gain, FIGS. 2c and 2d depict PGA 200 operating in another S&H phase and another amplifying phase, respectively, when providing a 4 times (4×) gain.

Referring first to FIG. 2c, there is shown the S&H stage for implementing the required sampling to obtain a gain of $$4V_{in}-V_{ref}.$$

As shown, switch 216 is closed, thereby connecting the inverting input of amplifier 212 to the ground reference (node 4). In addition, switches 202, 206, 208 and 210 are closed and switch 204 is opened, thereby connecting the second terminal of capacitors C1, C2, C3 and C4 to $V_{in}$ (node 1). As a result, capacitors C1, C2, C3 and C4 accumulate a charge of $$Q=(C1+C2+C3+C4)V_{in}.$$

The amplifying stage is activated next, after completing the above described S&H phase. Referring now to FIG. 2d, there is shown the amplifying stage for implementing a 4 times (4×) gain of $[4V_{in}-V_{ref}]$. As shown, PGA 200 is now configured to operate in the amplifying phase. The switches 202 and 216 are both opened, thereby placing the charge accumulated by capacitor C1 between the inverting input of amplifier 212 and output node 5 of amplifier 212. This conserves the charge accumulated by capacitor C1 during the S&H phase.

Furthermore, the second terminals of capacitors C2 and C3 are switched to node 2, thereby providing a ground reference by way of switches 206 and 208. This provides an additional charge to capacitor C1 as follows:

$$Q_{2,3}=(C2+C3)V_{in}.$$

Moreover, the second terminal of capacitor C4 is now connected, by way of switch 210, to node 3, which provides the reference voltage $V_{ref}$. As a result, yet another charge is provided to capacitor C1 as follows:

$$Q_4=C4(V_{in}-V_{ref}).$$

Adding all the charges, the final charge stored in capacitor C1 is as follows:

$$Q_f=C1V_{in}+C4(V_{in}-V_{ref})+(C2+C3)V_{in}.$$

Since the same value of capacitance, C, is used for each capacitor C1, C2, C3 and C4, the voltage level at output node 5 is as follows:

$$V_{out}=(2CV_{in}-CV_{ref}+2CV_{in})/C \text{ or}$$

$$V_{out}=4V_{in}-V_{ref}.$$

Upon examining the operations of the S&H phase and the amplifying phase of PGA 200, it will be appreciated that the input capacitance during the S&H phase (shown in FIG. 2a) is C1+C4, or 2C. The input capacitance, however, during the S&H phase (shown in FIG. 2c) is C1+C2+C3+C4, or 4C. The input capacitance, therefore, changes from 2C to 4C, as the gain of the amplifying stage changes from 2× gain to 4× gain. As a result, optimizing the operation of PGA 200, when operating as depicted by FIGS. 2a-2d, is difficult.

An improved operation of PGA 200, however, in which the input capacitance remains substantially constant (or fixed) regardless of the amount of gain provided by its amplifying stage, will now be described, by reference to FIGS. 3a, 3b, 3c and 3d.

Referring to FIGS. 3a-3d, a first terminal of each capacitor C1, C2, C3, and C4 is connected to the inverting input of amplifier 312. The second terminal of each capacitor is connected to a specific signal (such as $V_{in}$, $V_{out}$, $V_{ref}$ or ground reference) by way of switches 302, 304, 306, 308 and 310. The inverting input of amplifier 312 is connected to the ground reference, by way of switch 316. How and when these switches are opened or closed depend on whether PGA 300 is in the S&H phase (executed by the S&H stage of PGA 300) or in the amplifying phase (executed by the amplifying stage of PGA 300). The operation of these switches during the S&H phase and the amplifying phase will now be described.

Figure 3A:
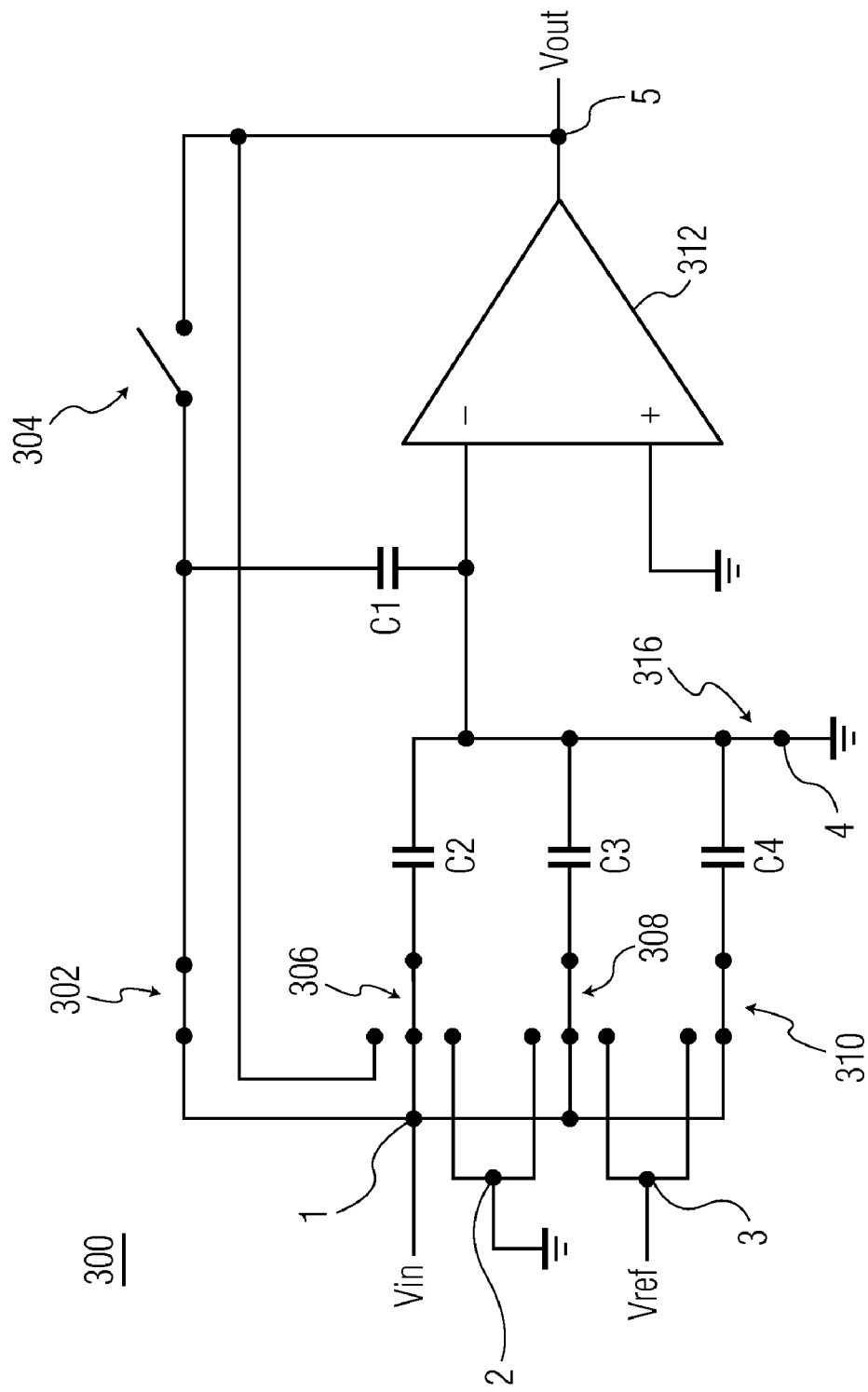
FIG. 3a is a schematic diagram of another programmable gain amplifier (PGA) providing two times (2×) gain, configured to operate as a sample and hold (S&H) stage.

FIG. 3a depicts the S&H stage for implementing the required sampling to obtain a two times (2×) gain of $$2V_{in}-V_{ref}.$$

As shown, switch 316 is closed, thereby connecting the inverting input of amplifier 312 to the ground reference (node 4). In addition, switch 316 is closed, thereby connecting the inverting input of amplifier 312 to the ground reference (node 4). In addition, the arms of switches 302, 306, 308 and 310 are all positioned to connect to node 1, while switch 304 is opened, thereby connecting the second terminal of capacitors C1, C2, C3 and C4 to $V_{in}$ (node 1). As a result, capacitors C1, C2, C3 and C4 accumulate a charge of $$Q=(C1+C2+C3+C4)V_{in}.$$

Figure 3B:
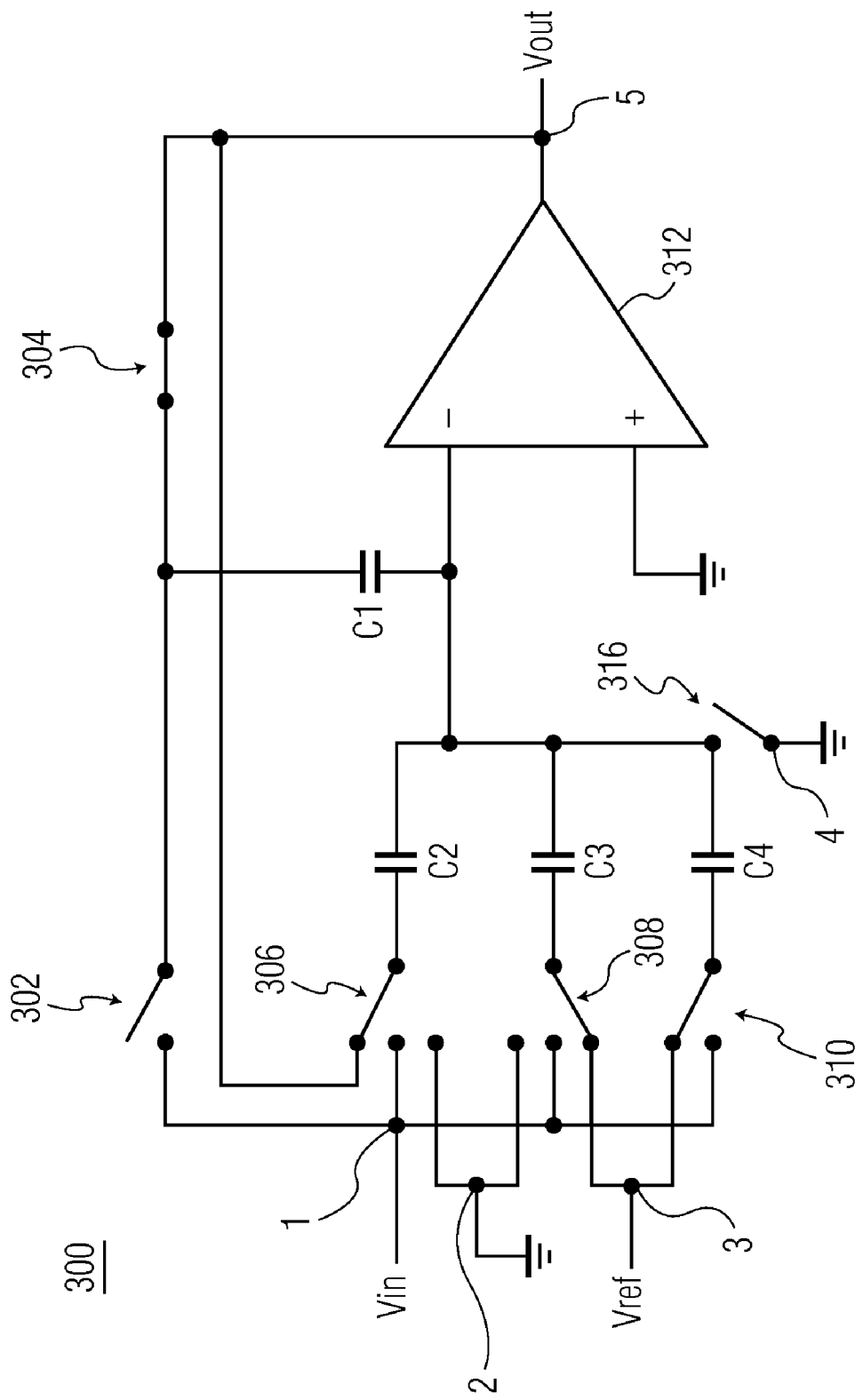
FIG. 3b is a schematic diagram of the PGA shown in FIG. 3a providing two times (2×) gain, configured to operate as an amplifying stage, in accordance with an embodiment of the present invention.

The amplifying stage is activated, after completing the S&H phase. Referring next to FIG. 3b, there is shown the amplifying stage for implementing the two times (2×) gain of $[2V_{in}-V_{ref}]$.

As shown in FIG. 3b, PGA 300 is now configured to operate in the amplifying phase. Accordingly, switch 316 is opened, thereby removing the ground reference (node 4) from the inverting input of amplifier 312. In addition, switch 302 is opened and switch 304 is closed, thereby connecting the second terminal of capacitor C1 to node 5, or the output voltage $V_{out}$ of amplifier 312. Furthermore, the arm of switch 306 is connected to node 5. As a result, the entire charge across capacitors C1 and C2 is now placed between the inverting node and output node 5 of amplifier 312. This conserves the charge accumulated by capacitors C1 and C2.

The second terminals of capacitors C3 and C4 are connected to the voltage reference $V_{ref}$ of node 3, by way of switches 308 and 310, as shown in FIG. 3b. As a result of capacitors C3 and C4 now connected to $V_{ref}$, an additional charge of $$Q_{3,4}=(C3+C4)(V_{in}-V_{ref})$$

is provided to capacitor C1. Therefore, the final charge, $Q_f$, stored in capacitor C1 is as follows:

$$Q_f=(C1+C2)V_{in}+(C3+C4)(V_{in}-V_{ref}).$$

It will be appreciated that the same value of capacitance, C, is used for each capacitor C1, C2, C3, and C4. As a result, the voltage level at output node 5 is as follows:

$$V_{out}=Q_f/(C1+C2)$$

$$V_{out}=(4CV_{in}-2CV_{ref})/2C \text{ or}$$

$$V_{out}=2V_{in}-V_{ref}.$$

Figure 3C:
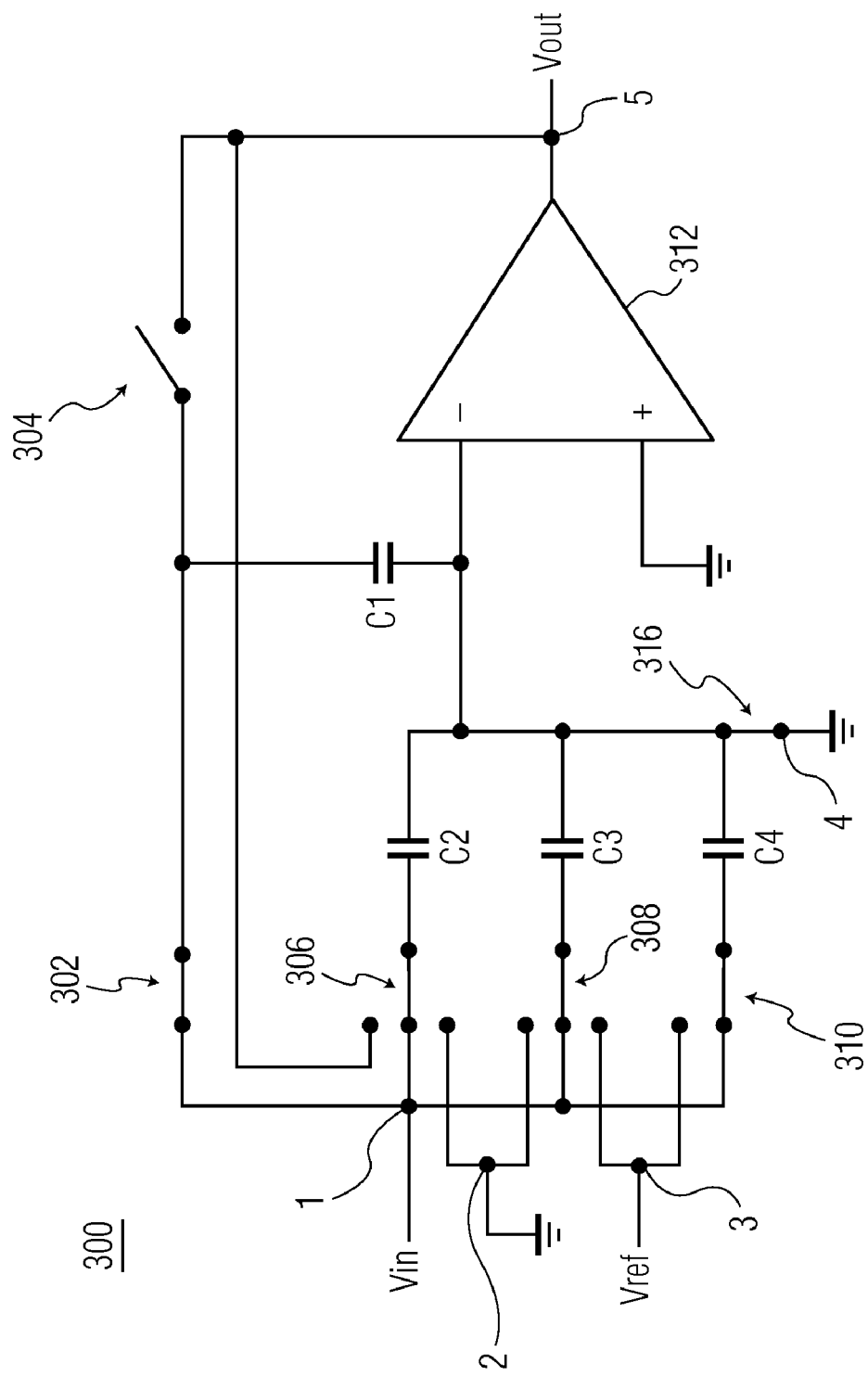
FIG. 3c is a schematic diagram of the PGA shown in FIG. 3a providing four times (4×) gain, configured to operate as a sample and hold (S&H) stage, in accordance with an embodiment of the present invention.
Figure 3D:
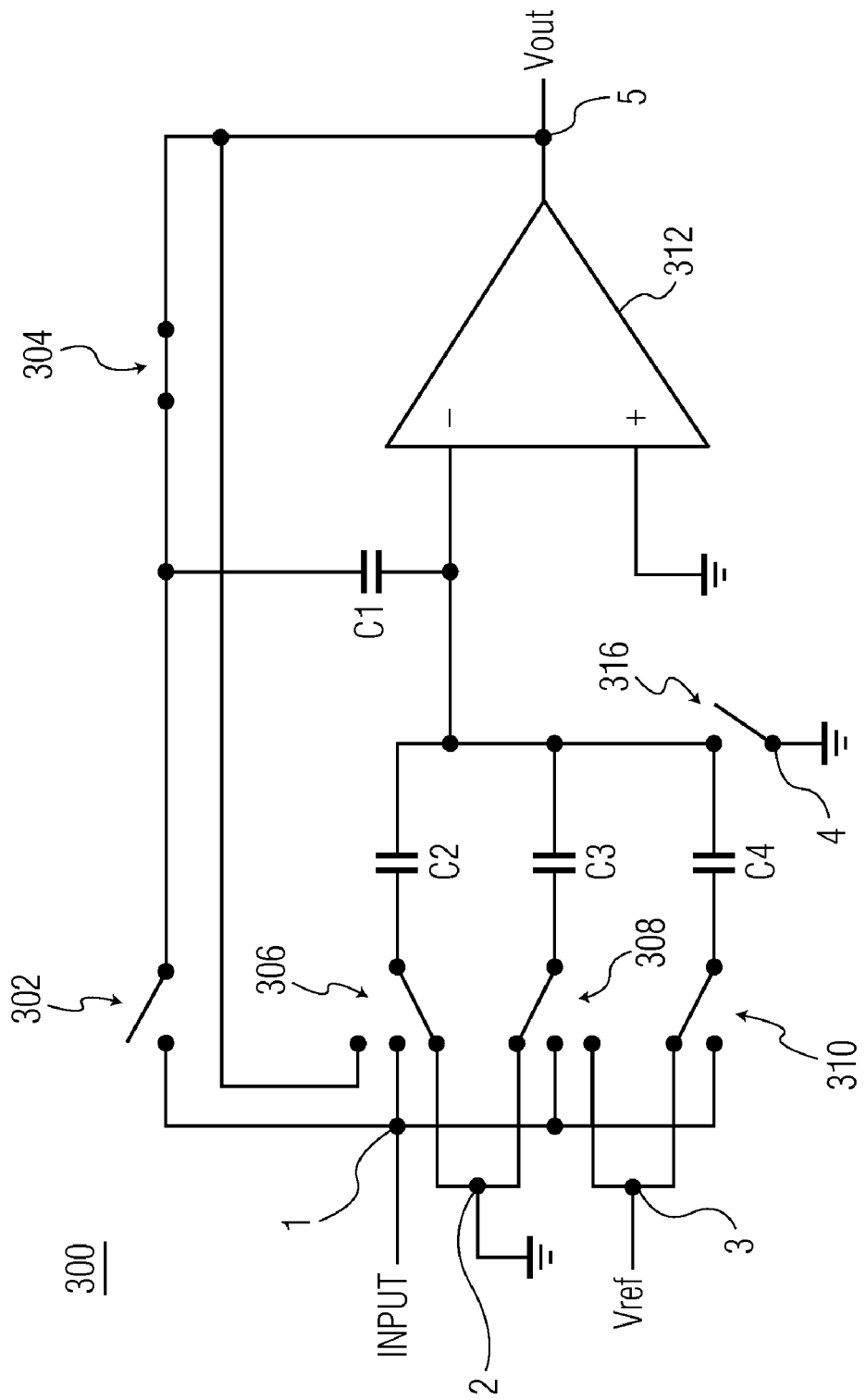
FIG. 3d is a schematic diagram of the PGA shown in FIG. 3a providing four times (4×) gain, configured to operate as an amplifying stage, in accordance with an embodiment of the present invention.

FIGS. 3c and 3d will now be described. Whereas FIGS. 3a and 3b depict PGA 300 operating in the S&H phase and the amplifying phase, respectively, when providing a 2 times (2×) gain, FIGS. 3c and 3d depict PGA 300 operating in another S&H phase and another amplifying phase, respectively, when providing a 4 times (4×) gain.

Referring first to FIG. 3c, there is shown the S&H stage for implementing the required sampling to obtain a gain of $$4V_{in}-V_{ref}.$$

As shown, switch 316 is closed, thereby connecting the inverting input of amplifier 312 to the ground reference (node 4). In addition, switches 302, 306, 308 and 310 are closed and switch 304 is opened, thereby connecting the second terminal of capacitors C1, C2, C3 and C4 to $V_{in}$ (node 1). As a result, capacitors C1, C2, C3 and C4 accumulate a charge of $$Q=(C1+C2+C3+C4)V_{in}.$$

The S&H operation of the S&H stage to implement the 4× gain is exactly the same as the S&H operation of the S&H stage which implements the 2× gain.

The amplifying stage is activated next, after completing the S&H phase. Referring now to FIG. 3d, there is shown the amplifying stage for implementing a 4 times (4×) gain of $[4V_{in}-V_{ref}]$. As shown, PGA 300 is now configured to operate in the amplifying phase. The switches 302 and 316 are both opened, thereby placing the charge accumulated by capacitor C1 between the inverting input of amplifier 312 and output node 5 of amplifier 312. This conserves the charge accumulated by capacitor C1 during the S&H phase.

Furthermore, the second terminals of capacitors C2 and C3 are switched to node 2, thereby providing a ground reference by way of switches 306 and 308. This provides an additional charge to capacitor C1 as follows:

$$Q_{2,3}=(C2+C3)V_{in}.$$

Moreover, the second terminal of capacitor C4 is now connected, by way of switch 310, to node 3, which provides the reference voltage $V_{ref}$. As a result, yet another charge is provided to capacitor C1 as follows:

$$Q_4=C4(V_{in}-V_{ref}).$$

Adding all the charges, the final charge stored in capacitor C1 is as follows:

$$Q_f=C1V_{in}+C4(V_{in}-V_{ref})+(C2+C3)V_{in}.$$

Since the same value of capacitance, C, is used for each capacitor C1, C2, C3 and C4, the voltage level at output node 5 is as follows:

$$V_{out}=(2CV_{in}-CV_{ref}+2CV_{in})/C \text{ or}$$

$$V_{out}=4V_{in}-V_{ref}.$$

The amplifying operation of the amplifying stage to implement the 4× gain is exactly the same as the amplifying stage which implements the 2× gain.

Upon examining the operations of the S&H phase and the amplifying phase of PGA 300, it will be appreciated that the input capacitance during the S&H phase (shown in FIG. 3a) is C1+C2+C3+C4, or 4C. The input capacitance during the S&H phase (shown in FIG. 3c) is also C1+C2+C3+C4, or 4C. The input capacitance, therefore, is a constant, as the gain of the amplifying stage changes from 2× gain to 4× gain. As a result, optimizing the operation of PGA 300, when operating as depicted by FIGS. 3a-3d, is easier to achieve.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A programmable gain amplifier (PGA) comprising
a sample-and-hold (S&H) stage having an input capacitance value for providing a stored charge during a first phase, and
an amplifying stage providing a gain during a second phase, the gain dependent on the stored charge,
wherein the amplifying stage is configured to provide a variable gain,
the S&H stage is configured to provide a substantially constant input capacitance value into the amplifying stage, and the
second phase follows the first phase in time.

2. The PGA of claim 1 including an input voltage Vin and a reference voltage Vref, wherein
the amplifying stage is configured to provide an output voltage of Vout, as follows:

$$V\text{out}=GV\text{in}-V\text{ref},$$

where G is a variable gain, and
the input capacitance value is substantially constant for the variable G.

3. The PGA of claim 2 wherein
the S&H stage and the amplifying stage both include a common node connected to a plurality of capacitors, and
the common node is connected to an inverting input terminal of an operational amplifier.

4. The PGA of claim 3 wherein
each capacitor of the plurality of capacitors includes first and second terminals,
the first terminal of each capacitor is connected to the common node, and the second terminal of each capacitor is connected to the input voltage Vin, when the S&H stage is activated during the first phase.

5. The PGA of claim 4 wherein
the operational amplifier includes an output node,
the plurality of capacitors includes capacitors C1, C2, C3 and C4, and
the second terminals of capacitors C1 and C2 are connected to the output node, when the amplifying stage is activated during the second phase.

6. The PGA of claim 5 wherein
the second terminals of capacitors C3 and C4 are connected to the reference voltage Vref, when the amplifying stage is activated during the second phase.

7. The PGA of claim 6 wherein G has a value of 2.

8. The PGA of claim 4 wherein
the operational amplifier includes an output node,
the plurality of capacitors includes capacitors C1, C2, C3 and C4, and
when the amplifying stage is activated during the second phase, the following occurs:
(a) the second terminal of C1 is connected to the output node,
(b) the second terminal of C2 is connected to a ground reference,
(c) the second terminal of C3 is connected to the ground reference,
(d) the second terminal of C4 is connected to the reference voltage Vref.

9. The PGA of claim 8 wherein
G has a value of 4.

10. The PGA of claim 1 including
a pixel array coupled to the S&H stage, and
an analog-to-digital converter (ADC) coupled to the amplifying stage.

11. An imaging device including a PGA comprising:
a S&H stage for sampling an input voltage Vin, corresponding to intensity of charge provided from a pixel array,
an operational amplifier for amplifying the sampled voltage Vin and providing an output voltage Vout,
multiple capacitors, each having first and second terminals, and
a control circuit for controlling charging and discharging of the multiple capacitors,
wherein each of the multiple capacitors are charged to a substantially constant level by the control circuit, when the S&H stage is activated during a first phase, and
at least one capacitor is discharged differently from another capacitor of the multiple capacitors by the control circuit, when the operational amplifier is activated during a second phase to provide an amount of amplification between Vin and Vout,
wherein the multiple capacitors are configured to provide a substantially constant input capacitance into the operational amplifier, regardless of the amount of amplification between Vin and Vout.

12. The imaging device of claim 11 wherein
the first terminal of each capacitor is connected to an inverting input terminal of the operational amplifier, and
the second terminal of each capacitor is connected to the input voltage Vin, when the S&H stage is activated.

13. The imaging device of claim 12 further including
the inverting input terminal of the operational amplifier is connected to a ground reference, when the S&H stage is activated.

14. The imaging device of claim 11 wherein
the first terminal of each capacitor is connected to an inverting input terminal of the operational amplifier, and
the second terminal of each capacitor is connected to one of the output voltage Vout, a reference voltage Vref, or a ground reference, when the operational amplifier is activated.

15. A method of controlling a PGA having a S&H phase and an amplifying phase, the method comprising the steps of:
charging multiple capacitors, during the S&H phase, by sampling an input voltage Vin;
controlling the multiple capacitors during the S&H phase, by storing a substantially constant charge Q based on the input voltage Vin;
discharging the multiple capacitors, during the amplifying phase, to provide an output voltage Vout at an output terminal of an operational amplifier; and
controlling the multiple capacitors, during the amplifying phase, to provide a desired gain between Vin and Vout;
wherein controlling the multiple capacitors includes providing a variable gain between Vin and Vout, after storing the substantially constant charge Q.

16. The method of claim 15 wherein
each of the multiple capacitors includes first and second terminals, and
the first terminal of each capacitor is connected to an inverting input terminal of the operational amplifier, and
the step of controlling the multiple capacitors during the S&H phase includes the steps of:
connecting the second terminal of each capacitor to the input voltage Vin; and
grounding the inverting input terminal of the operational amplifier.

17. The method of claim 15 wherein
each of the multiple capacitors includes first and second terminals, and
the first terminal of each capacitor is connected to an inverting input terminal of the operational amplifier, and
the step of controlling the multiple capacitors during the amplifying phase includes the steps of:
connecting the second terminal of at least one capacitor of the multiple capacitors to the output terminal of the operational amplifier; and
connecting the second terminal of at least another capacitor of the multiple capacitors to a voltage reference Vref.

18. The method of claim 17 wherein
the step of controlling the multiple capacitors during the amplifying phase includes the steps of:
connecting the second terminal of yet another capacitor of the multiple capacitors to the output terminal of the operational amplifier, when the desired gain is 2; and
connecting the second terminal of yet the other capacitor to a ground reference, when the desired gain is 4.

19. The method of claim 15 including the steps of:
providing the input voltage Vin from a pixel array; and
providing the output voltage Vout to an ADC.

20. An image capture device comprising:
a pixel array for converting incident light into electrical energy,
a sample-and-hold stage for sampling the electrical energy to provide a sampled signal, and
an amplifier stage for amplifying the sampled signal, the amplifier stage having a controlled variable gain between an input terminal and an output terminal,
wherein the sample-and-hold stage includes multiple capacitors arranged into a first mode of operation for holding a charge corresponding to the electrical energy, and the multiple capacitors are arranged into a second mode of operation to provide a constant value of capacitance at the input terminal, regardless of an amount of the controlled variable gain.

21. The image capture device of claim 20 wherein the amplifier stage and the sample-and-hold stage have the same multiple capacitors.

22. The image capture device of claim 20 wherein a controller is coupled to the amplifier stage and the sample-and-hold stage for arranging the multiple capacitors into the first and second modes of operation.

23. The image capture device of claim 22 including multiple switches coupled to the multiple capacitors, each switch controllable by the controller for charging/discharging a respective capacitor.

24. The image capture device of claim 20 wherein the first mode of operation is configured to charge each of the multiple capacitors to a substantially constant level, and the second mode of operation is configured to discharge at least one capacitor differently from another capacitor of the multiple capacitors.

25. The image capture device of claim 20 including an analog-to-digital converter coupled to the amplifying stage for providing a digital output signal corresponding to the amplified sampled signal, and a digital processor for processing the digital output signal.

26. The image capture device of claim 20 wherein the sample-and-hold stage and the amplifier stage are part of a programmable gain amplifier.

\* \* \* \* \*